United States Patent
Forbes et al.

(10) Patent No.: US 6,232,643 B1
(45) Date of Patent: May 15, 2001

(54) MEMORY USING INSULATOR TRAPS

(75) Inventors: Leonard Forbes, Corvallis, OR (US); Joseph E. Geusic, Berkeley Heights, NJ (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 08/969,099

(22) Filed: Nov. 13, 1997

(51) Int. Cl.$^7$ ................................................. H01L 29/792
(52) U.S. Cl. ............................................ 257/405; 257/651
(58) Field of Search .................................. 257/405, 406, 257/651

(56) References Cited

U.S. PATENT DOCUMENTS

| | | | |
|---|---|---|---|
| 4,507,673 | 3/1985 | Aoyama et al. .................... 357/23 R |
| 4,939,559 | 7/1990 | DiMaria et al. .................... 357/23.5 |
| 5,021,999 | 6/1991 | Kohda et al. ........................ 365/168 |
| 5,027,171 | 6/1991 | Reedy et al. ........................ 357/23.5 |
| 5,111,430 | 5/1992 | Morie .................................. 365/185 |
| 5,253,196 | 10/1993 | Shimabukuro ....................... 365/45 |
| 5,293,560 | 3/1994 | Harari ................................. 365/185 |
| 5,298,447 | 3/1994 | Hong ..................................... 437/43 |
| 5,317,535 | 5/1994 | Talreja et al. ........................ 365/185 |
| 5,388,069 | 2/1995 | Kokubo ............................... 365/185 |
| 5,424,993 | 6/1995 | Lee et al. ............................. 365/218 |
| 5,430,670 | 7/1995 | Rosenthal ............................. 365/45 |
| 5,434,815 | 7/1995 | Smarandoiu et al. ........... 365/189.01 |
| 5,438,544 | 8/1995 | Makino ................................ 365/185 |
| 5,449,941 | 9/1995 | Yamazaki et al. ................... 257/411 |
| 5,467,306 | 11/1995 | Kaya et al. ........................ 365/185.2 |
| 5,477,485 | 12/1995 | Bergemont et al. ............ 365/185.24 |
| 5,485,422 | 1/1996 | Bauer et al. .......................... 365/168 |
| 5,493,140 | 2/1996 | Iguchi .................................. 257/316 |
| 5,508,543 | 4/1996 | Hartstein et al. .................... 257/314 |
| 5,627,781 | 5/1997 | Hayashi et al. ................... 365/185.2 |
| 5,670,790 | 9/1997 | Katoh et al. .......................... 257/14 |
| 5,714,766 | 2/1998 | Chen et al. ............................. 257/20 |
| 5,740,104 | * 4/1998 | Forbes et al. .................... 365/185.03 |
| 5,754,477 | 5/1998 | Forbes .............................. 365/185.33 |

FOREIGN PATENT DOCUMENTS

| | | | |
|---|---|---|---|
| 3-222367 | 10/1991 | (JP) | ............................. H01L/29/784 |
| 6-224431 | 8/1994 | (JP) | ............................. H01L/29/784 |
| 6-302828 | 10/1994 | (JP) | ............................. H01L/29/788 |
| 8-255878 | 10/1996 | (JP) | ............................. H01L/27/10 |

OTHER PUBLICATIONS

Wolf, S., In: *Silicon Processing for the VLSI Era,* vol. 1, Lattice Press, Sunset Beach, CA, p. 227, (1990).

(List continued on next page.)

Primary Examiner—David B. Hardy
(74) Attorney, Agent, or Firm—Schwegman, Lundberg, Woessner & Kluth, P.A.

(57) ABSTRACT

A memory cell provides point defect trap sites in an insulator for storing data charges. Single electrons are stored on respective point defect trap sites and a resulting parameter, such as transistor drain current, is detected. By adjusting the density of the point defect trap sites, more uniform step changes in drain current are obtained as single electrons are stored on or removed from respective trap sites. By also adjusting the trapping energy of the point defect trap sites, the memory cell provides either volatile data storage, similar to a dynamic random access memory (DRAM), or nonvolatile data storage, similar to an electrically erasable and programmable read only memory (EEPROM). The memory cell is used for storing binary or multi-state data.

26 Claims, 4 Drawing Sheets

OTHER PUBLICATIONS

Wolf, S., In: *Silicon Processing for the VLSI Era,* vol. 2, Lattice Press, Sunset Beach, CA, p. 319, (1990).

Wolf, S., "Ion Implantation for VLSI", *Silicon Processing for the VLSI Era*, vol. 1, 280, (1990).

Adler, E., et al., "The Evolution of IBM CMOS DRAM Technology", *IBM Journal of Research and Development*, 39, 167–188, (Jan./Mar., 1995).

Alok, D., et al., "Electrical Properties of Thermal Oxide Grown on N–type 6H–Silicon Carbide", *Applied Physcis Letters*, 64, 2845–2846, (May 23, 1994).

Boeringer, D.W., et al. "Avalanche amplificaiton of multiple resonant tunneling through parallel silicon microcrystallites", *Physical Rev. B*, 51, 13337–13343, (1995).

DeKeersmaecker, R., et al., "Electron Trapping and Detrapping Characteristics of Arsenic–Implanted SiO(2) Layers", *J. Appl. Phys.*, 51, 1085–1101, (Feb. 1980).

Demichelis, F., et al., "Influence of Doping on the Structural and Optoelectronic Properties of Amorphous and Microcrystalline Silicon Carbide", *Journal of Applied Physics*, 72, 1327–1333, (Aug. 15, 1992).

Demichelis, F., et al., "Physical Properties of Undoped and Doped Microcrystalline SiC:H Deposited By PECVD", Materials Research Society Symposium Proceedings, 219, Anaheim, CA, 413–418, (Apr. 30–May 3, 1991).

DiMaria, D., et al., "Capture and Emission of Electrons at 2.4–eV–Deep Trap Level in SiO(2) Films", *Physical Review B*, 11, 5023–5030, (Jun. 1975).

DiMaria, D., et al., "Enhanced Conduction and Minimized Charge Trapping in Electrically Alterable Read–Only Memories Using Off–Stoichiometric Silicon Dioxide Films", *J. Appl. Phys.*, 55, 3000–3019, (Apr. 1984).

Dipert, B., et al., "Flash Memory Goes Mainstream", *IEEE Spectrum*, 30, 48–52, (1993).

Edelberg, E., et al., "Visible Luminescence from Nanocrystalline silicon films produced by plasma enhanced chemical vapor deposition", *Appl. Phys. Lett.*, 68, 1415–1417, (1996).

Forbes, L., et al., "Field Induced Reemission of Electrons Trapped in SiO(2)", *IEEE Trans. on Electron Devices*, ED–26, 1816–1818, (Nov. 1979).

Forbes, L., et al., "Thermal Re–Emission of Trapped Hot Electrons in NMOS Transistors", *IEEE Trans. on Electron Devices*, 38, 2712, (Dec. 1991).

Hamakawa, Y., et al., "Optoelectronics and Photovoltaic Applications of Microcrystalline SiC", *Materials Research Society Symposium Proceedings*, 164, Boston, MA, 291–301, (Nov. 29–Dec. 1, 1989).

Hanafi, H., et al., "Fast and Long Retention–Time Nano–Crystal Memory", *IEEE Trans. on Electron Devices*, 43, 1553–1558, (Sep. 1996).

Hori, T., et al., "A MOSFET with Si–Implanted Gate–SiO(2) Insulator for Nonvolatile Memory Applications", *Int'l Electron Devices Meeting: Technical Digest*, San Francisco, CA, 469–472, (Dec. 1992).

Hsu, C., et al., "Observation of Threshold Oxide Electric Field for Trap Generation in Oxide Films on Silicon", *J. Appl. Phys.*, 63, 5882–5884, (Jun. 1988).

Hu, G., "Will Flash Memory Replace Hard Disk Drive?", *IEEE Electron Devices Meeting, Session 24*, (Dec. 13, 1994).

Huntley, D., et al., "Deep Traps in Quartz and Their Use for Optical Dating", *Canadian J. Physics*, 74, 81–91, (Mar./Apr. 1996).

Hwang, N., et al., "Tunneling and Thermal Emission of Electrons at Room Temperature and Above from a Distribution of Deep Traps in SiO2", *Proc. Int'l Elec. Devices and Materials Symp.*, Taiwan, 559–562, (Nov. 1992).

Hwang, N., et al., "Tunneling and Thermal Emission of Electrons from a Distribution of Deep Traps in SiO2", *IEEE Trans on Electron Devices*, 40, 1100–1103, (Jun. 1993).

Hybertsen, M.S., "Absorption and Emission of Light in Nanoscale Silicon Structures", *Phys. Rev. Lett.*, 72, 1514–1517, (1994).

Jung, T.S., et al., "A 3.3V, 128Mb Multi–Level NAND Flash Memory for Mass Storage Applications", 1996 *IEEE Solid–State Circuits Conf.*, Digest of Technical Papers, 512, (1996).

Kalnitsky, A., et al., "Memory Effect and Enhanced Conductivity in Si–Implanted Thermally Grown SiO(2)", *IEEE Trans. on Electron Devices*, ED–34, 2372, (Nov. 1987).

Kalnitsky, A., et al., "Rechargeable E' Centers in Silicon–Implanted SiO(2) Films", *J. Appl. Phys.*, 67, 7359–7367, (Jun. 1990).

Kamata, T., et al., "Substrate Current Due to Impact Ionization in MOS–FET", *Japan. J. Appl. Phys.*, 15, 1127–1134, (Jun. 1976).

Kato, M., et al., "Read–Disturb Degradation Mechanism due to Electron Trapping in the Tunnel Oxide for Low–voltage Flash Memories", *IEEE Electron Device Meeting*, 45–48, (1994).

Lee, M., et al., "Thermal Self–Limiting Effects in the Long–Term AC Stress on N–Channel LDD MOSFET's", Proc.: 9th Biennial University/Government/Industry Microelectronics Symp., Melbourne, FL, 93–97, (Jun., 1991).

Ohkawa, M., et al., "A 98 mm 3.3V 64Mb Flash Memory with FN–NOR type 4–Level Cell", *IEEE*, 512, (1996).

Prendergast, J., "Flash or DRAM: Memory Choice for the Future", *IEEE Electron Device Meeting, Session 25*, Phoenix, AZ, (1995).

Schoenfeld, O., et al., "Formation of Si Quantum dots in Nanocrystalline silicon", Proc. 7th Int. Conf. on Modulated Semiconductor Structures, Madrid, 605–608, (1995).

Shimabukuro, R.L., et al., "Circuitry for Artificial Neural Networks with Non–volatile Analog Memories", IEEE Int'l Symp. on Circuits and Systems, 2, 1217–1220, (1989).

Shimabukuro, R.L., et al., "Dual–Polarity Nonvolatile MOS Analogue Memory (MAM) Cell for Neural–Type Circuitry", *Electronics Lett.*, 24, 1231–1232, (Sep. 15, 1988).

Suh, K.D., et al., "A 3.3 V 32 Mb NAND Flash Memory with Incremental Step Pulse Programming Scheme", *IEEE J. Solid–State Circuits*, 30, 1149–1156, (Nov. 1995).

Takeuchi, K., et al., "A Double–Level–V Select Gate Array Architecture for Multilevel NANAD Flash Memories", *IEEE Journal of Solid–State Circuits*, 31, 602–609, (Apr. 1996).

Thomas, J., et al., "Electron Trapping Levels in Silicon Dioxide Thermally Grown in Silicon", *J. Physics and Chemistry of Solids*, 33, 2197–2216, (1972).

Thompson, S., et al., "Positive Charge Generation in SiO(2) by Electron–Impact Emission of Trapped Electrons", *J. Appl. Phys.*, 72, 4683–4695, (Nov. 1992).

Thompson, S., et al., "Tunneling and Thermal Emission of Electrons from a Distribution of Shallow Traps in SiO(2)", *Appl. Phys. Lett.*, 58, 1262–1264, (Mar. 1991).

Tiwari, S., et al., "A silicon nanocrystal based memory", *Appl. Physics Lett.*, 68, 1377–1379, (1996).

Tiwari, S., et al., "Volatile and Non–Volatile Memories in Silicon with Nano–Crystal Storage", *Int'l Electron Devices Meeting: Technical Digest*, Washington, DC, 521–524, (Dec. 1995).

Tsu, R., et al., "Slow Conductance oscillations in nanoscale silicon clusters of quantum dots", *Appl. Phys. Lett.*, 65, 842–844, (1994).

Tsu, R., et al., "Tunneling in Nanoscale Silicon Particles Embedded in an SiO/sub/2 Matrix", *Abstract, IEEE Device Research Conference*, 178–179, (1996).

Vuillaume, D., et al., "Charging and Discharging Properties of Electron Traps Created by Hot–Carrier Injections in Gate Oxide of N–Channel Metal Oxide Semiconductor Field Effect Transistor", *J. Appl. Phys.*, 73, 2559–2563, (Mar. 1993).

Ye, Q., et al., "Resonant Tunneling via Microcrystalline––silicon quantum confinement", *Physical Rev. B*, 44, 1806–1811, (1991).

Yih, C.M., et al., "A Consistent Gate and Substrate Current Model for Sub–Micron MOSFET'S by Considering Energy Transport", *Int'l Symp. on VLSI Tech., Systems and Applic.*, Taiwan, 127–130, (1995).

Young, D., et al., "Characterization of Electron Traps in Aluminum–Implanted SiO(2)", *IBM J. Research and Development*, 22, 285–288, (May 1978).

Zhao, X., et al., "Nanocrystalline Si: a material constructed by Si quantum dots", 1st Int. Conf. on Low Dimensional Structures and Devices, Singapore, 467–471, (1995).

* cited by examiner

MEMORY USING INSULATOR TRAPS

CROSS REFERENCE TO RELATED APPLICATIONS

This application is related to a co-pending, commonly assigned U.S. patent application of L. Forbes, entitled "A MULTI-STATE FLASH MEMORY CELL AND METHOD FOR PROGRAMMING SINGLE ELECTRON DIFFERENCES," now U.S. Pat. No. 5,740,104, issued Apr. 14, 1998, which disclosure is herein incorporated by reference.

TECHNICAL FIELD OF THE INVENTION

This invention relates generally to integrated circuits and particularly, but not by way of limitation, to an integrated circuit memory device using insulator traps for storing charge.

BACKGROUND OF THE INVENTION

Integrated circuit memory devices provide both volatile and nonvolatile storage of data. One goal in designing such devices is to increase the storage density so that more data can be stored in a memory device that occupies less volume. One technique of increasing storage density is described in a co-pending, commonly assigned U.S. patent application of L. Forbes, entitled "A MULTI-STATE FLASH MEMORY CELL AND METHOD FOR PROGRAMMING SINGLE ELECTRON DIFFERENCES," now U.S. Pat. No. 5,740,104, issued Apr. 14, 1998, which disclosure is herein incorporated by reference.

The 08/790,903 U.S. patent application discloses a flash memory cell. The cell includes a transistor with a floating gate that is formed from a number of crystals of semiconductor material. The crystals are disposed in the gate oxide of the transistor. The size of the crystals and their distance from a surface of a semiconductor layer of the transistor are selected such that the crystals can trap a single electron by hot electron injection. Each trapped electron causes a measurable change in the drain current of the transistor. Thus, multiple data bits can be stored and retrieved by counting the changes in the drain current.

One potential shortcoming of the memory cell disclosed in the 08/790,903 U.S. patent application is that it does not necessarily have uniformly sized crystals. Instead, the grains have a finite grain size that may vary between individual grains. As a result, the capacitance of individual grains may also vary between individual grains. Even if such grains are capable of storing only a single electron, the resulting voltage on any particular grain may depend on the grain size. As electrons are being stored on respective grains, the resulting drain current may change in irregularly sized steps, making memory states differing only by a single stored electron difficult to distinguish. For the reasons described above, and for other reasons that will become apparent upon reading the following detailed description of the invention, there is a need for a memory cell that provides more uniformity in the step changes in drain current as single electrons are being stored on the memory cell.

SUMMARY OF THE INVENTION

The present invention provides, among other things, a memory cell that provides more uniformity in step changes in drain current as single electrons are being stored on the memory cell. In one embodiment, the invention provides a memory cell comprising an insulator carrying trap sites at a density such that the trap sites are substantially shielded from each other by intervening portions of the insulator. In another embodiment, the invention provides a memory cell comprising an insulator carrying point defect trap sites that are electrically isolated from each other by intervening portions of the insulator. In a further embodiment, the invention provides a memory cell comprising a transistor, including a source, a drain, a channel region between the source and drain, a control gate, an insulator between the control gate and the channel region, and a floating gate. The floating gate includes point defect trap sites that are carried by the insulator and electrically isolated from each other by intervening portions of the insulator.

Another aspect of the invention provides memory device comprising an array of memory cells. Each memory cell includes a transistor in which a gate insulator carries trap sites at a density such that the trap sites are substantially shielded from each other by intervening portions of the insulator. The memory device also includes addressing circuitry coupled to the array of memory cells for accessing individual memory cells in the array of memory cells, and a read circuit coupled to the memory cell array and reading data from memory cells in the array of memory cells. Another aspect of the invention provides a computer system including the memory device as described above.

Another aspect of the invention provides a method of storing and retrieving data. The method includes altering the number of electrons stored on a memory cell in trap sites carried by an insulator at a density such that the trap sites are substantially shielded from each other by intervening portions of the insulator. A resulting parameter (e.g., current, voltage, or charge) is detected. The resulting parameter is based on the number of electrons stored in the trap sites.

In summary, the memory cell provides point defect trap sites in an insulator for storing data charges. Single electrons are stored on respective point defect trap sites and a resulting parameter, such as transistor drain current, is detected. By adjusting the density of the point defect trap sites, more uniform step changes in drain current are obtained as single electrons are stored on or removed from respective trap sites. By also adjusting the trapping energy of the point defect trap sites, the memory cell provides either volatile data storage, similar to a dynamic random access memory (DRAM), or nonvolatile data storage, similar to an electrically erasable and programmable read only memory (EEPROM). The memory cell is used for storing binary or multi-state data.

BRIEF DESCRIPTION OF THE DRAWINGS

In the drawings, like numerals describe substantially similar components throughout the several views.

DETAILED DESCRIPTION OF THE INVENTION

Figure 2:
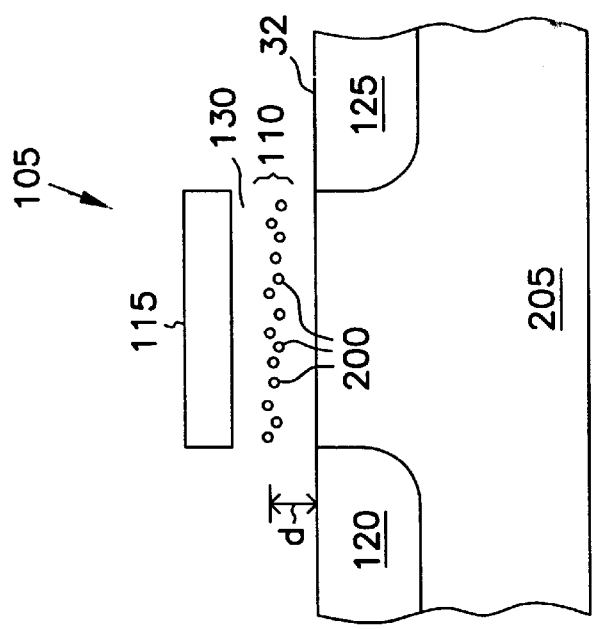
FIG. 2 is a cross-sectional diagram illustrating generally one embodiment of transistor according to one aspect of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Figure 1:
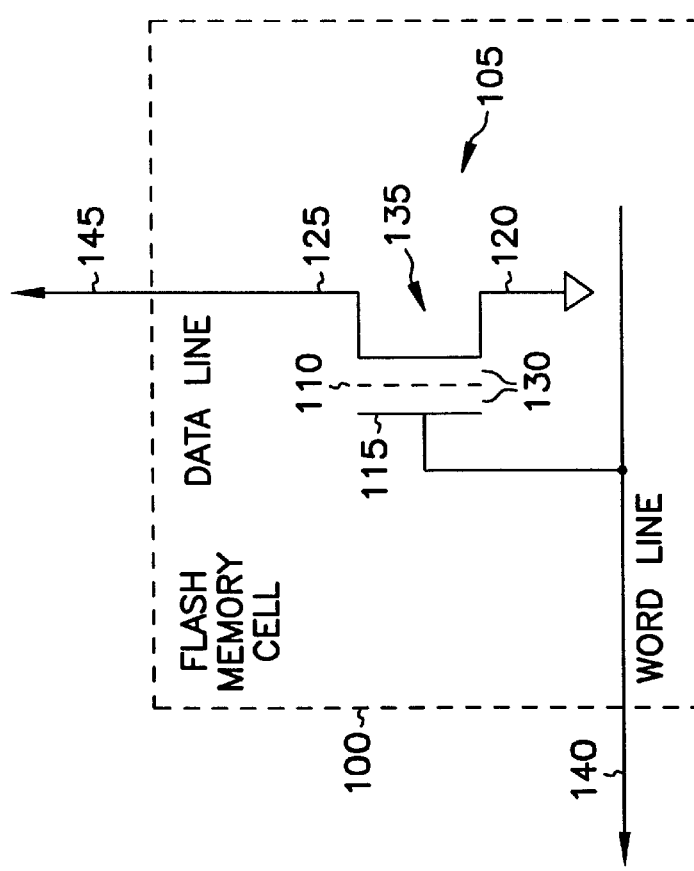
FIG. 1 is a schematic diagram illustrating generally one embodiment of a memory cell according to one aspect of the present invention.

FIG. 1 is a schematic diagram illustrating generally, by way of example, but not by way of limitation, one embodiment of a memory cell 100 according to one aspect of the present invention. Memory cell 100 is illustrated, by way of example, as a flash memory cell. However, memory cell 100 also includes, but is not limited to, a dynamic random access memory (DRAM) cell, a nonvolatile random access memory (NVRAM) cell, an electrically alterable read-only memory (EAROM) cell, a dynamic electrically alterable programmable read-only memory (DEAPROM), and any other similar memory cell providing either nonvolatile or volatile, binary or multi-state (e.g., digital or quantized analog) data storage.

Memory cell 100 includes a field-effect transistor (FET) 105 having a floating (i.e., electrically isolated) gate 110, a control gate 115, a source 120, and a drain 125. Following established convention, the terminals associated with the terms "source" and "drain" are actually determined by operating conditions of FET 105 (i.e., source 120 and drain 125 are interchangeable). A gate insulator 130 is interposed between control gate 115 and a channel region 135 is formed in a substrate between source 120 and drain 125. Memory cell 100 is addressed by word line 140, or any other conductor that is electrically coupled to control gate 115. Data in memory cell 100 is accessed through data line 145, or any other conductor that is electrically coupled to drain 125.

According to one aspect of the invention, floating gate 110 includes at least one trap site, such as a point defect trap site, capable of receiving and storing an electron. According to another aspect of the invention, floating gate 110 includes a plurality of trap sites, such as point defect trap sites, each trap site capable of receiving and storing only a single electron. The trap sites are electrically isolated from each other. In the absence of an externally applied electric field, the stored electrons are substantially confined to their respective trap sites. According to another aspect of the invention, the trap sites are distributed at a density such that the trap sites are substantially shielded from each other by intervening portions of the gate insulator 130.

FIG. 2 is a cross-sectional diagram illustrating generally, by way of example, but not by way of limitation, one embodiment of transistor, such as FET 105 in memory cell 100, according to one aspect of the present invention. In one embodiment, gate insulator 130 is formed from amorphous silicon dioxide. In other embodiments, gate insulator 130 is formed from other materials, including, but not limited to: quartz, aluminum trioxide, titanium dioxide, lithium niobate, silicon nitride, and diamond.

In FIG. 2, floating gate 110 includes point defect trap sites 200. Each one of trap sites 200 is generally capable of receiving and storing only a single electron. In one embodiment, the trap sites have a cross-sectional area of capture of approximately $10^{15}$ cm$^2$. A number of different techniques are used to form trap sites 200 according to the present invention. According to one aspect of the present invention, for example, process conditions of existing semiconductor fabrication steps are adjusted to obtain the desired trap sites 200. In one embodiment, gate insulator 130 is formed of silicon dioxide. The silicon dioxide is formed by thermal oxidation of a silicon substrate 205. In this embodiment, the oxidizing ambient is adjusted between O$_2$ (dry oxidation) and H$_2$O vapor (wet oxidation) to obtain the desired density of trap sites 200. Alternatively, or in combination with the above-described oxidation techniques, a subsequent annealing time and annealing ambient are varied to obtain the desired density of trap sites 200.

In another embodiment, trap sites 200 are formed by ion-implantation of impurities, such as aluminum (Al), silicon (Si), or arsenic (As), into gate insulator 130. Other species of impurities may also be used. According to one aspect of the invention, the ion-implantation energy is adjusted such that the trap sites 200 are generally implanted at a distance (d) from substrate, where d is approximately ⅓ of the thickness of the insulator between control gate 115 and substrate 205. A resulting approximately Gaussian distribution of trap sites 200 is thereby located relatively close to the interface between gate insulator 230 and substrate 205. According to another aspect of the invention, an ion-implant dose is adjusted for low-density disposition of the trap sites 200, such that the trap sites 200 are generally substantially shielded from each other by intervening portions of gate insulator 130. In one embodiment, the areal concentration of trap sites is approximately between $10^{12}$ and $10^{15}$ trap sites 200 per cm$^2$. As a result, particular ones of the trap sites 200 do not substantially overlap others of the trap sites 200. In one embodiment, the concentration of the trap sites is adjusted to avoid agglomeration of point defect trap sites 200 into nanocrystals of the implanted impurity.

As described above, one aspect of the invention includes a distribution of point defect trap sites 200 serving as a floating gate 110. The trap sites 200 are distinguishable from a conventional floating gate transistor having a continuous conductor as an electrically isolated floating gate. For example, conventional floating gate transistors typically utilize Fowler-Nordheim tunneling for transporting charge from a floating gate to the underlying channel. By contrast, one aspect of a transistor having a floating gate comprising point defect trap sites is that it is characterized by Price-Sah tunneling for transporting charge from the point defects to the underlying channel. See, e.g., L. Forbes et al., "Tunneling and Thermal Emission of Electrons at Room Temperature and Above from a Distribution of Deep Traps in SiO$_2$," *IEEE Trans. On Electron Devices*, Vol. 40, No. 6, pp. 1100–1103, (June 1993) and T. Nishida et al., "Tunneling and Thermal Emission of Electrons from a Distribution of Shallow Traps in SiO$_2$," *Appl. Phys. Lett.*, Vol. 58, pp. 1262–64 (1991).

The point defect trap sites 200 are also distinguishable from a floating gate comprising a distribution of conductive elements, such as silicon nanocrystals, in a gate insulator, such as described in the co-pending, commonly assigned U.S. patent application "A MULTI-STATE FLASH MEMORY CELL AND METHOD FOR PROGRAMMING SINGLE ELECTRON DIFFERENCES," Ser. No. 08/790, 903, filed on Jan. 29, 1997, which disclosure is herein incorporated by reference. Nanocrystalline silicon grains have a finite grain size that may vary between individual grains. As a result, the capacitance of individual grains may vary between individual grains. Even if such grains are capable of storing only a single electron, the resulting voltage on any particular grain may depend on the grain size. As electrons are being stored on respective grains (e.g., to represent a digital data input or an analog data input), the resulting drain current may change in irregularly sized steps. By contrast, the point defect trap sites 200 according to the present invention do not have a variable grain size, capacitance, and resulting voltage. As electrons are being stored on their respective point defects, the drain current changes in more regularly sized steps, allowing easy differentiation between memory states, such as memory states differing by only a single stored electron.

The point defect trap sites 200 are also distinguishable from a floating gate comprising a heterostructure, such as a graded bandgap structures in which several electrons are stored in a localized potential minimum. Point defect trap sites 200 allow storage of only a single electron. For a particular number of memory states, less charge must be transported to the point defect trap sites 200 than to one or more heterostructure potential minima. As a result, the present invention reduces oxide fatigue and increases the reliability and cyclability of the FET memory cell 100.

According to one aspect of the present invention, the trap sites 200 are selected to have a particular trap energy for obtaining a desired data charge retention time (i.e., the average time that an electron is retained on the point defect trap site for a particular temperature) and for minimizing erasure time (i.e., how long it takes to remove approximately all of the stored electrons from respective point defect trap sites by applying a large negative voltage to the control gate of the FET). The data charge retention time is determined by the rate at which electrons are thermally emitted from the trap sites 200, which is described by Arrhenius Equation 1.

$$R_e = Be^{(-\frac{E}{kT})} \quad (1)$$

In Equation 1, $R_e$ is the thermally activated emission rate from the traps (in reciprocal units of time), B is a constant that is approximately independent of temperature, E is the trap energy as measured from the conduction band of the host insulator, k is Boltzman's constant, and T is absolute temperature in degrees Kelvin. B and E both depend on the detailed physical nature of the trap and the host insulator.

Figure 3:
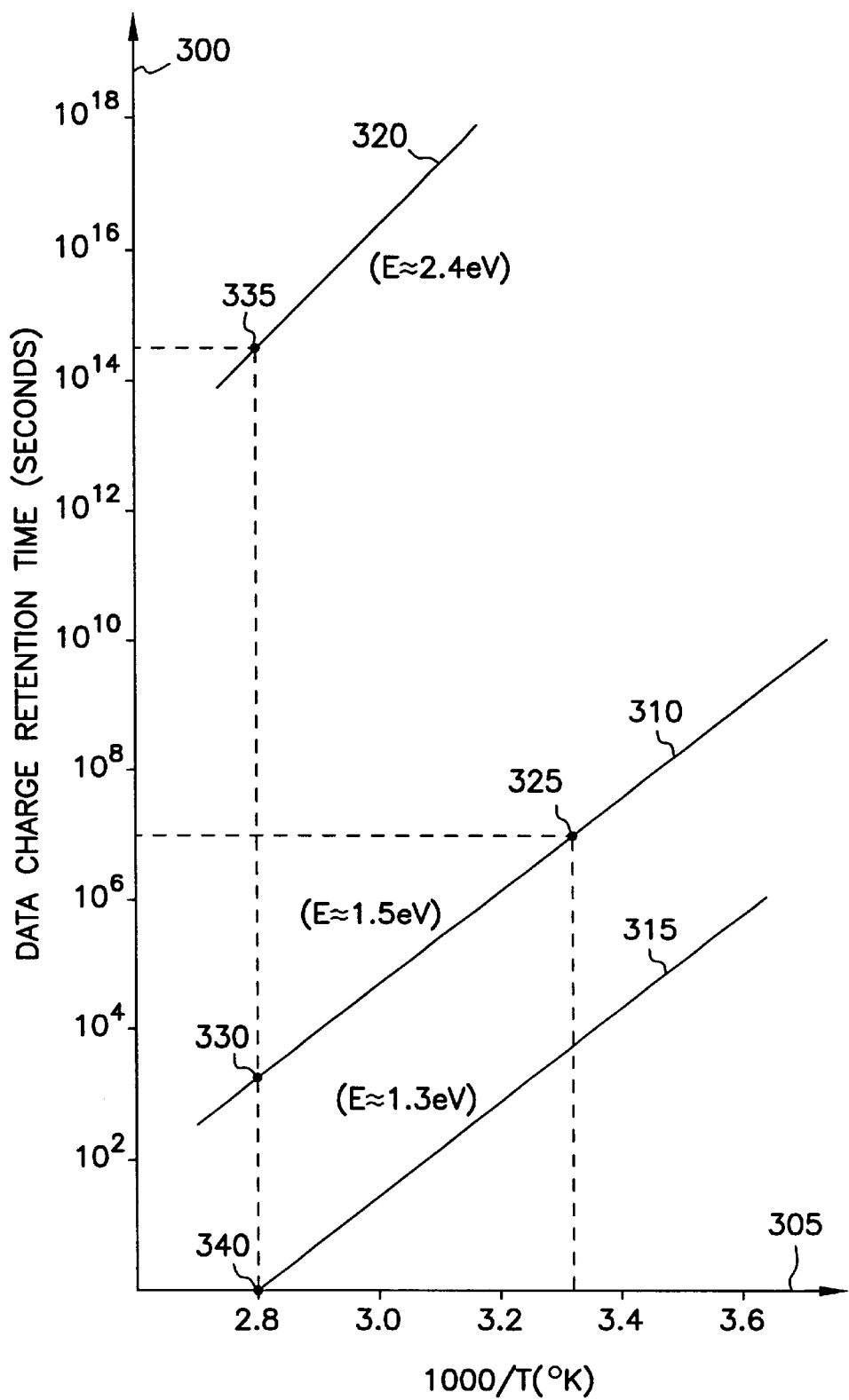
FIG. 3 is a graph illustrating generally data charge retention time vs. reciprocal temperature for point defect traps in a silicon dioxide insulator, parameterized for three different values of trap energy.

FIG. 3 is a graph illustrating generally data charge retention time 300 vs. reciprocal temperature 305 for point defect trap sites 200 in a silicon dioxide insulator, parameterized for three different values of trap energy. Data charge retention time 300 is illustrated in units of seconds. Reciprocal temperature is illustrated in units of 1000/T, where T is absolute temperature in degrees Kelvin. Line 310 illustrates generalized experimental data from point defect traps having an average energy of approximately 1.5 eV, as set forth in L. Forbes et al., "Tunneling and Thermal Emission of Electrons at Room Temperature and Above from a Distribution of Deep Traps in SiO$_2$," *IEEE Trans. On Electron Devices*, Vol. 40, No. 6, pp. 1100–1103, (June 1993). Line 310 yields an approximate value of B=1.8×10$^{18}$. Line 315 illustrates values calculated from Equation 1, using B=1.8×10$^{18}$ and a trap energy of E=1.3 eV. Line 320 illustrates values calculated from Equation 1, using B=1.8×10$^{18}$ and a trap energy of E=2.4 eV.

In one embodiment of the present invention, the graph of FIG. 3 is used to select a particular trap energy for obtaining the desired data charge retention time. Point defect trap sites 200 having the desired trap energy are formed, such as using the processing techniques described above, or any other suitable processing technique for obtaining the desired trap energy and corresponding data charge retention time.

For example, by selecting a trap energy of E=1.5 eV, as illustrated by line 310, a data charge retention time estimated at approximately 10 million seconds (2800 hours) is obtained at point 325 at a temperature of approximately 300 degrees Kelvin (27 degrees Celsius). A data charge retention time estimated at approximately 6000 seconds (approximately 1.6 hours) is obtained at point 330 at a temperature of 358 degrees Kelvin (85 degrees Celsius), which corresponds to the highest operating temperature for which commercial semiconductor components are typically designed.

In another example, by selecting a trap energy of E=2.4 eV, as illustrated by line 320, a data charge retention time estimated at approximately 1014 seconds (approximately 3 million years) is obtained at point 335 at a temperature of 358 degrees Kelvin (85 degrees Celsius). At lower temperatures, longer data charge retention times are obtained. The long data charge retention times obtained from this embodiment of memory cell 100 provide nonvolatile data storage functionality that is comparable to an EEPROM or magnetic hard disk drive memory. According to another aspect of this embodiment of the present invention, the desired trap energy is also selected based on a desired maximum tolerable erase time (e.g., in the range of approximately 1 second) when a negative erase voltage is applied to control gate 115 to eject electrons from trap sites 200.

In another example, by selecting a trap energy of E=1.3 eV, as illustrated by line 315, a data charge retention time of approximately 1 second is obtained at point 340 at a temperature of 358 degrees Kelvin (85 degrees Celsius). At lower temperatures, longer data charge retention times are obtained. The data charge retention times obtained from this embodiment of memory cell 100 provide volatile data storage functionality that is comparable to a DRAM memory. According to another aspect of this embodiment of the present invention, the desired trap energy is also selected based on a desired maximum tolerable erase time (e.g., in the range of approximately 1 millisecond) when a negative erase voltage is applied to control gate 115 to eject electrons from trap sites 200.

Another aspect of the invention provides short write times for data storage. For example, in one embodiment, point defect trap sites 200 have a cross-sectional area of capture of approximately 10$^{-15}$ cm$^2$. Charge is stored on trap sites 200 by hot electron injection. For example, by providing a hot electron injection gate current of approximately one microampere over an area of $10^{-8}$ cm$^2$, an electron flux of approximately $10^{21}$ electrons/(cm$^2$-sec) is obtained. Thus, resulting write times are approximately in the microsecond range, or even shorter.

Figure 4:
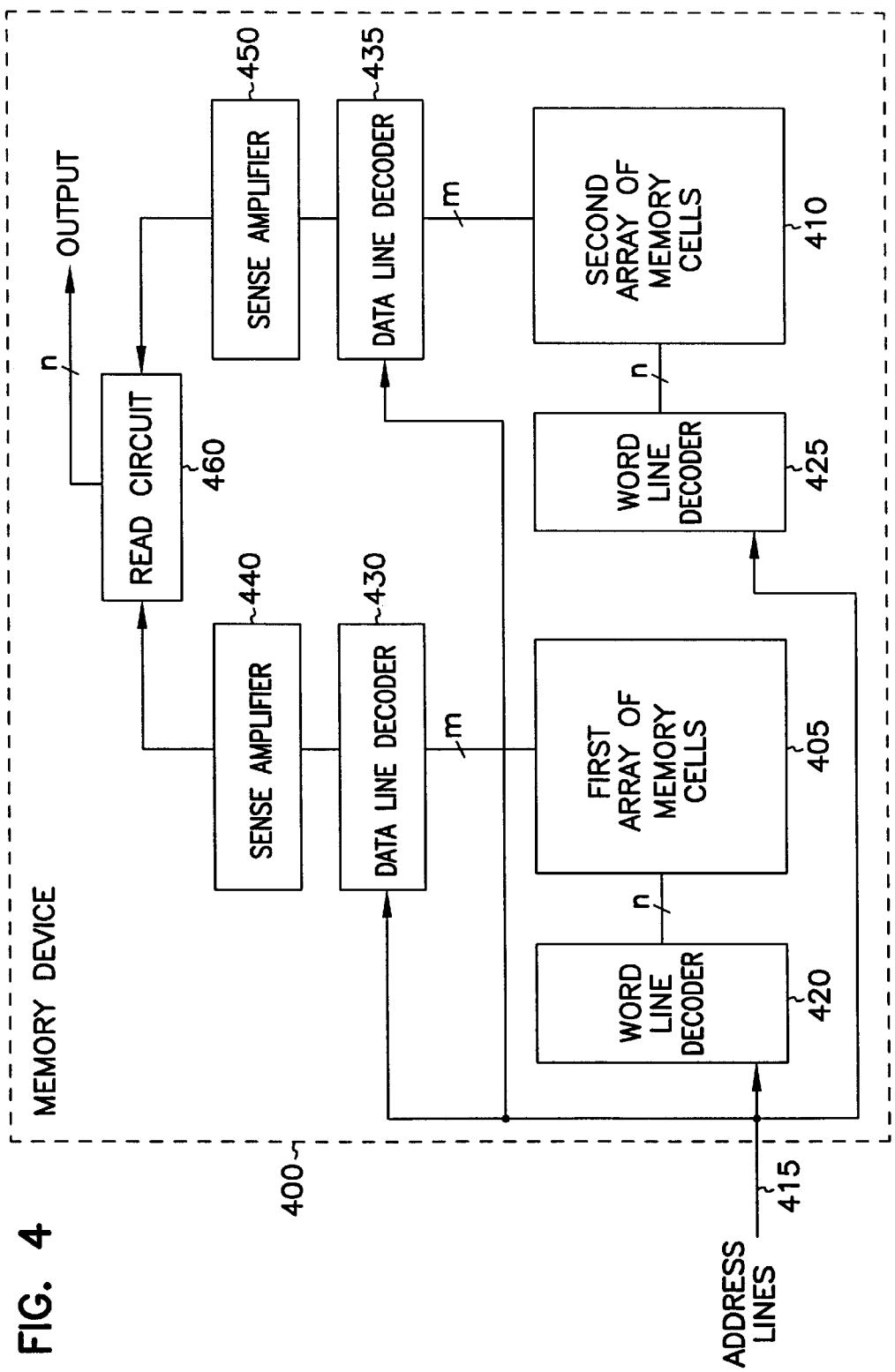
FIG. 4 is a block diagram illustrating generally one embodiment of a memory device that includes a memory cell according to the teachings of the present invention.

According to one aspect of the invention, memory cell 100 is included in a memory device that provides two-state (binary) or multi-state data storage. FIG. 4 is a block diagram illustrating generally, by way of example, but not by way of limitation, one embodiment of a memory device 400 that includes memory cell 100 according to the teachings of the present invention. Memory device 400 includes first and second arrays 405 and 410 of memory cells 100. Second array 410 stores the state of the memory cells 100 in first array 405 at a time prior to storing data in first array 405. Thus, second array 410 provides a comparison basis during a read operation for determining the number of step changes in drain current induced during the programming of a memory cell 100 during a write operation.

Each memory cell 100 of first array 405 is associated with a memory cell 100 of second array 410. The associated memory cells 100 may be accessed according to address signals provided by an external system such as a microprocessor, memory controller, or other external system. Address lines 415 are coupled to first and second word line decoders 420 and 425, and first and second data line decoders 430 and 435. First word line decoder 420 and first data line decoder 430 are coupled to first array 405. Similarly, second word line decoder 425 and second data line decoder 435 are coupled to second array 410. First and second sense amplifiers 440 and 450 are coupled to first and second data line decoders 430 and 435, respectively. Read circuit 460 is coupled to first and second sense amplifiers 440 and 450. Read circuit 460 provides the output of memory device 400.

In operation, memory device 400 writes, reads and erases multiple bits in each memory cell 100 storage location of first array 405.

In write mode, memory device 400 receives an address on address line 415. Word line decoders 420 and 425 decode the associated word line 140 for a selected memory cell 100 and activate the corresponding word line 140. Data line decoders 430 and 435 similarly decode the data line 145 for the desired memory cell 100. The data state of the selected memory cell 100 in first array 405 is stored in the associated memory cell 100 in second array 410. The selected memory cell 100 in first array 405 is then programmed to a selected state to store a value that represents a number of bits.

In read mode, the address of the selected memory cell 100 is similarly decoded and the associated memory cells 100 of first and second arrays 405 and 410, respectively, are accessed. Data line decoders 430 and 435 couple the selected cell to sense amplifiers 440 and 450, respectively. Read circuit 460 compares the stored value of the memory cell 100 from first array 405 with the initial state stored in the second array 410. The comparison results in an output signal that represents the value of a number of bits.

Figure 5:
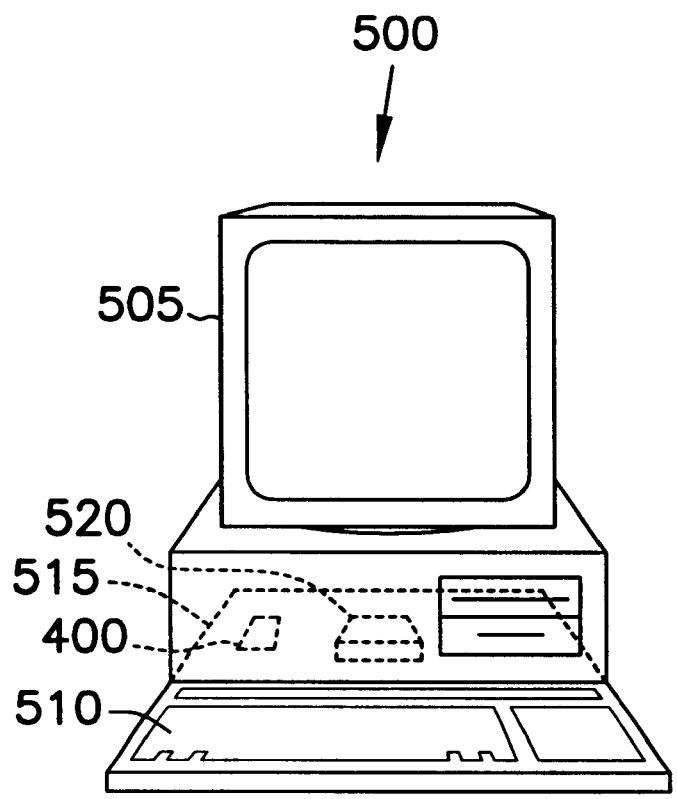
FIG. 5 is a drawing that illustrates generally, by way of example, but not by way of limitation, one embodiment of a computer system according to the present invention.

FIG. 5 is a drawing that illustrates generally, by way of example, but not by way of limitation, one embodiment of a computer system 500 according to the present invention. In one embodiment, computer system 500 includes a monitor 505 or other communication output device, a keyboard 510 or other communication input device, as well as a motherboard 515, carrying a microprocessor 520 or other data processing unit and at least one memory device 400.

CONCLUSION

The invention provides, among other things, a memory cell that uses point defect trap sites in an insulator for storing charge representing binary or multi-state data in volatile and nonvolatile memories. As additional electrons are stored upon the point defect trap sites, more uniform changes in drain current result. Memory states differing by only a single stored electron are more easily distinguished during a read operation. Oxide fatigue is reduced. The reliability and cyclability of memory cell is increased.

It is to be understood that the above description is intended to be illustrative, and not restrictive. Many other embodiments will be apparent to those of skill in the art upon reviewing the above description. The scope of the invention should, therefore, be determined with reference to the appended claims, along with the fill scope of equivalents to which such claims are entitled.

What is claimed is:

1. A memory cell comprising an insulator carrying trap sites at a density such that the trap sites are substantially shielded from each other by intervening portions of the insulator wherein the trap sites are capable of capturing no more than one electron.

2. The memory cell of claim 1, wherein the trap sites are point defects in the insulator.

3. The memory cell of claim 1, wherein the trap sites have a cross-sectional area of capture of approximately $10^{-15}$ cm$^2$.

4. The memory cell of claim 1, wherein the trap sites have a retention time of approximately between 1 second and 3 million years at a temperature of approximately 85 degrees Celsius.

5. The memory cell of claim 1, wherein the trap sites are carried in the insulator at an areal concentration that is approximately between $10^{12}$ and $10^{15}$ trap sites per square centimeter.

6. The memory cell of claim 1, wherein ones of the trap sites do not substantially overlap others of the trap sites.

7. The memory cell of claim 1, wherein the insulator is formed on a substrate, and the insulator has a thickness, and the trap sites are carried in the insulator at a distance from the substrate that is approximately ⅓ of a thickness of the insulator.

8. A memory cell comprising an insulator carrying trap sites at a density such that the trap sites are substantially shielded from each other by intervening portions of the insulator wherein the trap sites have a trapping energy of approximately between 1.3 eV and 2.4 eV.

9. A memory cell comprising an insulator carrying trap sites at a density such that the trap sites are substantially shielded from each other by intervening portions of the insulator wherein the insulator is selected from a group consisting essentially of amorphous silicon dioxide, quartz, aluminum trioxide, titanium dioxide, lithium niobate, silicon nitride, and diamond.

10. A memory cell comprising an insulator carrying point defect trap sites that are electrically isolated from each other by intervening portions of the insulator wherein the trap sites have a trapping energy of approximately between 1.3 eV and 2.4 eV.

11. The memory cell of claim 10, wherein the trap sites have a cross-sectional area of capture of approximately $10^{-15}$ cm$^2$.

12. The memory cell of claim 10, wherein the trap sites have a retention time of approximately between 1 second and 3 million years at a temperature of 85 degrees Celsius.

13. The memory cell of claim 10, wherein the trap sites are carried in the insulator at an areal concentration that is approximately between $10^{12}$ and $10^{15}$ trap sites per square centimeter.

14. The memory cell of claim 10, wherein the insulator is formed on a substrate, and the insulator has a thickness, and the trap sites are carried in the insulator at a distance from the substrate that is approximately ⅓ of a thickness of the insulator.

15. A memory cell comprising an insulator carrying point defect trap sites that are electrically isolated from each other by intervening portions of the insulator wherein the insulator is selected from a group consisting essentially of amorphous silicon dioxide, quartz, aluminum trioxide, titanium dioxide, lithium niobate, silicon nitride, and diamond.

16. A memory cell, comprising:
   a transistor, including a source a drain, a channel region between the source and drain, a control gate, an insulator between the control gate and the channel region, and a floating gate; and
   wherein the floating gate includes point defect trap sites that are carried by the insulator and electrically isolated from each other by intervening portions of the insulator and wherein the trap sites have a trapping energy of approximately between 1.3 eV and 2.4 eV.

17. The memory cell of claim 16, wherein the trap sites are carried by the insulator at a density such that the trap sites are substantially shielded from each other by intervening portions of the insulator.

18. The memory cell of claim 16, wherein the trap sites are capable of capturing no more than one electron.

19. The memory cell of claim 16, wherein the trap sites have a cross-sectional area of capture of approximately $10^{-15}$ cm$^2$.

20. The memory cell of claim 16, wherein the trap sites have a retention time of approximately between 1 second and 3 million years at a temperature of 85 degrees Celsius.

21. A memory cell, comprising:
   a transistor, including a source, a drain, a channel region between the source and drain, a control gate, an insulator between the control gate and the channel region, and a floating gate; and
   wherein the floating gate includes point defect trap sites that are carried by the insulator and electrically isolated from each other by intervening portions of the insulator and wherein the insulator is selected from a group consisting essentially of amorphous silicon dioxide, quartz, aluminum trioxide, titanium dioxide, lithium niobate, silicon nitride, and diamond.

22. A memory cell, comprising:
   a transistor, including a source, a drain, a channel region between the source and drain, a control gate, an insulator between the control gate and the channel region, and a floating gate; and
   wherein the floating gate includes point defect trap sites that are carried by the insulator and electrically isolated from each other by intervening portions of the insulator and wherein the insulator has a thickness between the control gate and the channel region, and the point defects are disposed at a distance from the channel region that is approximately ⅓ of the thickness of the insulator.

23. A memory cell, comprising:
   a transistor, including a source, a drain, a channel region between the source and drain, a control gate, an insulator between the control gate and the channel region, and a floating gate; and
   wherein the floating gate includes point defect trap sites that are carried by the insulator and electrically isolated from each other by intervening portions of the insulator and wherein the trap sites are carried in the insulator at an areal concentration that is approximately between $10^{12}$ and $10^{15}$ trap sites per square centimeter.

24. A memory cell comprising an insulator carrying trap sites at a density such that the trap sites are substantially shielded from each other by intervening portions of the insulator.

25. A memory cell comprising an insulator carrying point defect trap sites that are electrically isolated from each other by intervening portions of the insulator.

26. A memory cell, comprising:
   a transistor, including a source, a drain, a channel region between the source and drain, a control gate, an insulator between the control gate and the channel region, and a floating gate; and
   wherein the floating gate includes point defect trap sites that are carried by the insulator and electrically isolated from each other by intervening portions of the insulator.

* * * * *